(12) United States Patent
Li

(10) Patent No.: US 9,230,855 B2
(45) Date of Patent: Jan. 5, 2016

(54) INTERCONNECT STRUCTURE AND FORMING METHOD THEREOF

(71) Applicant: Shanghai Huahong Grace Semiconductor Manufacturing Corporation, Shanghai (CN)

(72) Inventor: Ernest Li, Shanghai (CN)

(73) Assignee: Shanghai Huahong Grace Semiconductor Manufacturing Corporation, Pudong, Shanghai (CN)

( * ) Notice: Subject to any disclaimer, the term of this patent is extended or adjusted under 35 U.S.C. 154(b) by 21 days.

(21) Appl. No.: 14/108,860

(22) Filed: Dec. 17, 2013

(65) Prior Publication Data

US 2014/0167271 A1   Jun. 19, 2014

(30) Foreign Application Priority Data

Dec. 19, 2012  (CN) .......................... 2012 1 0556457

(51) Int. Cl.

| | | |
|---|---|---|
| *H01L 21/4763* | (2006.01) | |
| *H01L 21/768* | (2006.01) | |
| *H01L 23/522* | (2006.01) | |
| *H01L 23/532* | (2006.01) | |

(52) U.S. Cl.
CPC ........ *H01L 21/7682* (2013.01); *H01L 23/5222* (2013.01); *H01L 23/5329* (2013.01); *H01L 23/53295* (2013.01); *H01L 2924/0002* (2013.01)

(58) Field of Classification Search
CPC ............ H01L 21/76877; H01L 23/525; H01L 21/768
USPC ................... 438/618–619, 622; 257/758, 763
See application file for complete search history.

(56) References Cited

U.S. PATENT DOCUMENTS

| | | | |
|---|---|---|---|
| 2004/0084774 A1* | 5/2004 | Li et al. .......................... | 257/758 |
| 2011/0018091 A1 | 1/2011 | Barth et al. | |

* cited by examiner

*Primary Examiner* — Theresa T Doan
(74) *Attorney, Agent, or Firm* — Harness, Dickey & Pierce, P.L.C.

(57) ABSTRACT

An interconnect structure and a forming method thereof are provided. The method includes: providing a semiconductor substrate which has semiconductor devices formed therein; forming a conductive layer on the semiconductor substrate; forming a mask layer on the conductive layer; forming a groove in the mask layer and the conductive layer, the groove having a depth-to-width ratio greater than 0.8; and depositing an intermetallic dielectric layer to cover the mask layer and fill the groove, wherein an air gap is formed in a portion of the intermetallic dielectric layer in the groove. The mask layer is formed on the conductive layer, so that the depth-to-width ratio of the groove between adjacent interconnects is increased. Besides, the air gap with a relatively large size is formed between two adjacent interconnects. Therefore, a dielectric constant and parasitic capacitance between adjacent interconnects are reduced evidently, and the performance of the semiconductor devices is improved.

16 Claims, 4 Drawing Sheets

INTERCONNECT STRUCTURE AND FORMING METHOD THEREOF

CROSS-REFERENCE TO RELATED APPLICATIONS

The present application claims priority to Chinese patent application No. 201210556457.1, filed on Dec. 19, 2012, and entitled "INTERCONNECT STRUCTURE AND FORMING METHOD THEREOF", and the entire disclosure of which is incorporated herein by reference.

FIELD OF THE DISCLOSURE

The present disclosure generally relates to semiconductor technology, and more particularly, to an interconnect structure and a forming method thereof.

BACKGROUND OF THE DISCLOSURE

Conventional methods for forming a metal interconnect structure may include:

referring to FIG. 1, providing a semiconductor substrate 100, forming an dielectric layer 101 on the semiconductor substrate 100, and forming a metal layer 102 on the dielectric layer 101;

referring to FIG. 2, forming a patterned photoresist layer on the metal layer 102 and etching the metal layer 102 by taking the patterned photoresist layer as a mask to form a groove 103, the metal layer 102 on two sides of the groove 103 forming metal interconnects; and referring to FIG. 3, depositing an intermetallic dielectric layer 104 which fills the groove 103 and covers the metal layer 102.

However, when technology node is developed to less than 90 nm, the distance between adjacent metal interconnects becomes shorter and parasitic capacitance generated therebetween becomes greater. The parasitic capacitance may not only affect a running speed of a chip but also reduce the reliability of devices on the chip. To alleviate the problem, materials with a high dielectric constant, such as silicon dioxide are replaced with low-K dielectric materials to form an interlayer dielectric layer and an intermetallic dielectric layer in semiconductor processes, which may reduce parasitic capacitance between adjacent metal interconnects. When technology node is developed to less than 32 nm, low-K dielectric materials may not have a good performance on reducing parasitic capacitance. Besides, even in processes with technology node of more than 90 nm, the conventional method of filling a groove between adjacent metal interconnects with an intermetallic dielectric layer, such as some radio frequency integrated circuits, cannot meet the technique requirement of minimizing parasitic capacitance between two adjacent metal interconnects.

To obtain more relative information of methods for forming a metal interconnect structure, please refer to US patent publication No. US2011/0018091A1.

SUMMARY

In conventional solutions, parasitic capacitance between adjacent metal interconnects is great.

In an embodiment, a method for forming an interconnect structure may be provided, including:

providing a semiconductor substrate which has semiconductor devices formed therein;

forming a conductive layer on the semiconductor substrate;

forming a mask layer on the conductive layer;

forming a groove in the mask layer and the conductive layer, the groove having a depth-to-width ratio greater than 0.8; and depositing an intermetallic dielectric layer to cover the mask layer and fill the groove, wherein an air gap is formed in a portion of the intermetallic dielectric layer in the groove.

Optionally, before forming the conductive layer, an interlayer dielectric layer may be formed on the semiconductor substrate.

Optionally, the interlayer dielectric layer and the intermetallic dielectric layer may include a low-K dielectric material or an ultra-low-K dielectric material.

Optionally, the intermetallic dielectric layer may include silicon dioxide.

Optionally, the interlayer dielectric layer may include silicon dioxide.

Optionally, the mask layer may include a hard mask layer.

Optionally, the conductive layer may include aluminum, copper or tungsten.

Optionally, the groove may be formed by a photoetching process or an etching process.

In an embodiment, an interconnect structure may be provided, including:

a semiconductor substrate which has semiconductor devices formed therein;

interconnects formed on the semiconductor substrate;

a mask layer formed on the interconnects;

grooves having a depth-to-width ratio greater than 0.8; and an intermetallic dielectric layer which covers the mask layer and fills the grooves, wherein air gaps are formed in a portion of the intermetallic dielectric layer in the grooves.

Optionally, an interlayer dielectric layer, which covers the semiconductor substrate, may be formed between the semiconductor substrate and the interconnects.

Optionally, the interlayer dielectric layer and the intermetallic dielectric layer may include a low-K dielectric material or an ultra-low-K dielectric material.

Optionally, the intermetallic dielectric layer may include silicon dioxide.

Optionally, the interlayer dielectric layer may include silicon dioxide.

Optionally, the mask layer may include a hard mask layer.

Optionally, the interconnects may include aluminum, copper or tungsten.

Compared with the conventional solutions, the present disclosure may have following advantages.

In the present disclosure, a mask layer is formed on interconnects so that a depth-to-width ratio (a ratio of height of grooves to width of grooves) of grooves formed between two adjacent interconnects is increased. Therefore, when an intermetallic dielectric layer is deposited, air gaps may be more easily formed in a portion of the intermetallic dielectric layer in the grooves. More importantly, a size of the air gaps to be formed may be increased. Air gaps between two adjacent interconnects with a larger size may ensure a smaller dielectric constant of the intermetallic dielectric layer between two adjacent interconnects and smaller parasitic capacitance between two adjacent interconnects, which reduces RC delay among semiconductor devices and power consumption of driving the interconnects, and improves the performance of the whole semiconductor devices. More particularly, in a radio frequency integrated circuit, coupling between adjacent interconnects may be reduced obviously.

DETAILED DESCRIPTION OF THE DISCLOSURE

Figure 1:
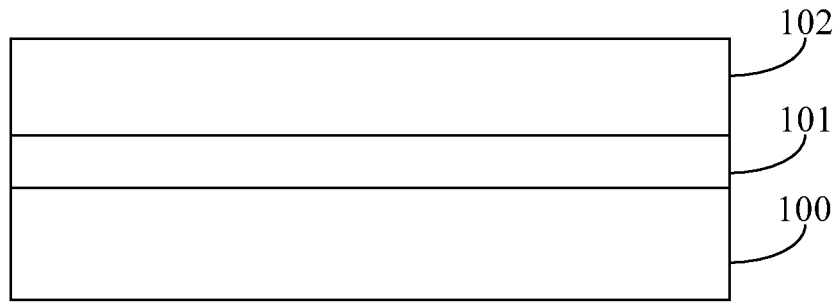
FIGS. 1 to 3 schematically illustrate sectional views of intermediate structures of a conventional method for forming an interconnect structure with air gaps.
Figure 2:
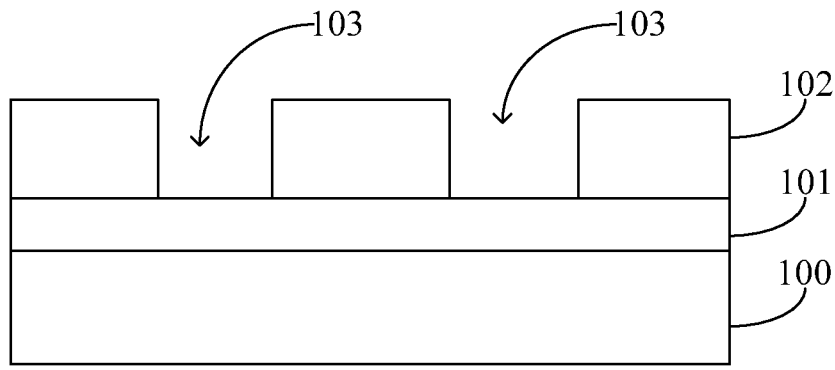
Figure 3:
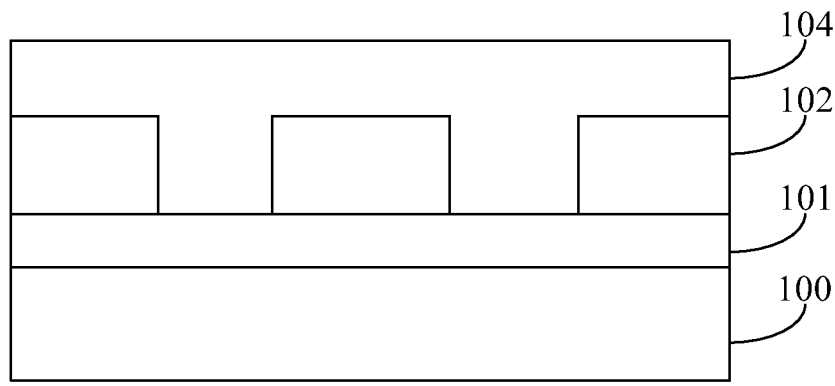
Figure 4:
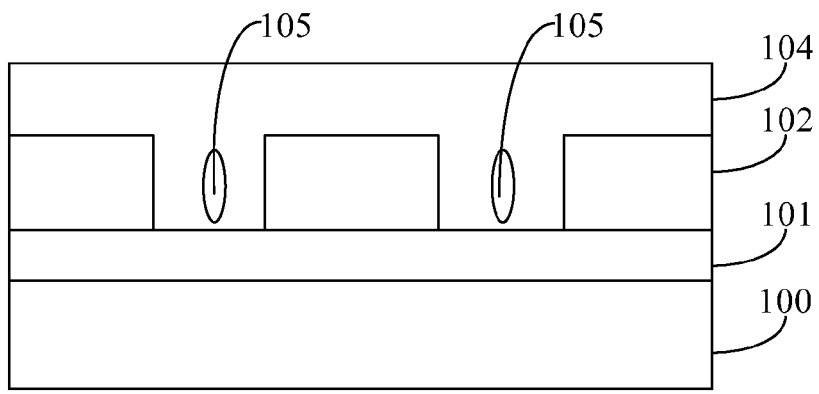
FIG. 4 schematically illustrates a sectional view of a conventional interconnect structure.

The inventors found that, referring to FIG. 4, when the distance between adjacent metal interconnects becomes shorter, air gaps 105 may be formed in an intermetallic dielectric layer 104 between two adjacent metal interconnects. The air gaps 105 may not increase parasitic capacitance between two adjacent metal interconnects and may reduce the parasitic capacitance. Therefore, forming air gaps between adjacent metal interconnects may effectively reduce parasitic capacitance between the metal interconnects.

The inventors have studied how to form air gaps in an intermetallic dielectric layer between adjacent metal interconnects and even how to form air gaps having a relatively large size.

A new method for forming an interconnect structure with air gaps is provided in the present disclosure.

In order to clarify the objects, characteristics and advantages of the disclosure, embodiments of present disclosure will be described in detail in conjunction with accompanying drawings. For convenience, elements in the drawings are not necessarily drawn to scale and the drawings as examples are not meant to limit the present disclosure. In practice, three-dimensional sizes including length, width and depth should be considered.

Figure 5:
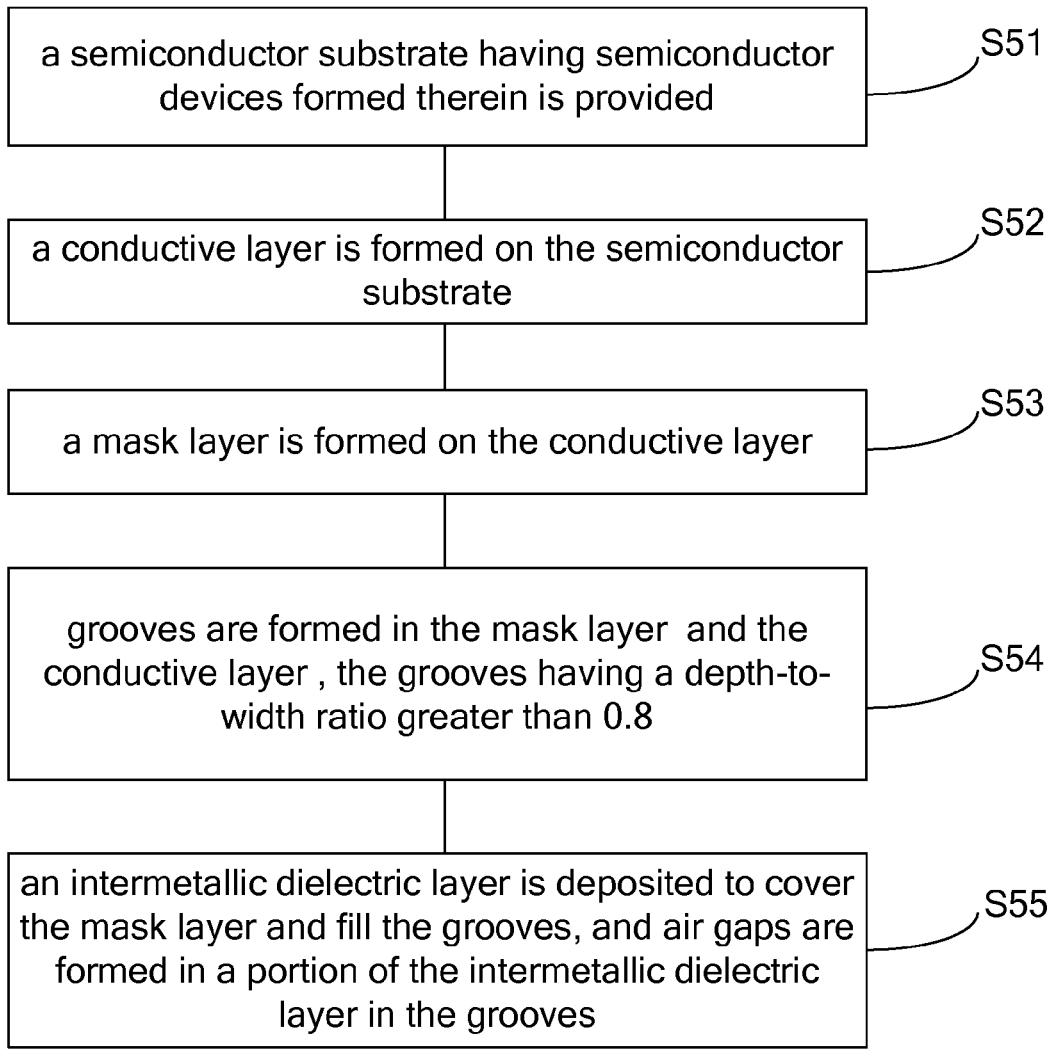
FIG. 5 schematically illustrates a flow chart of a method for forming an interconnect structure with air gaps according to one embodiment of the present disclosure.
Figure 6:
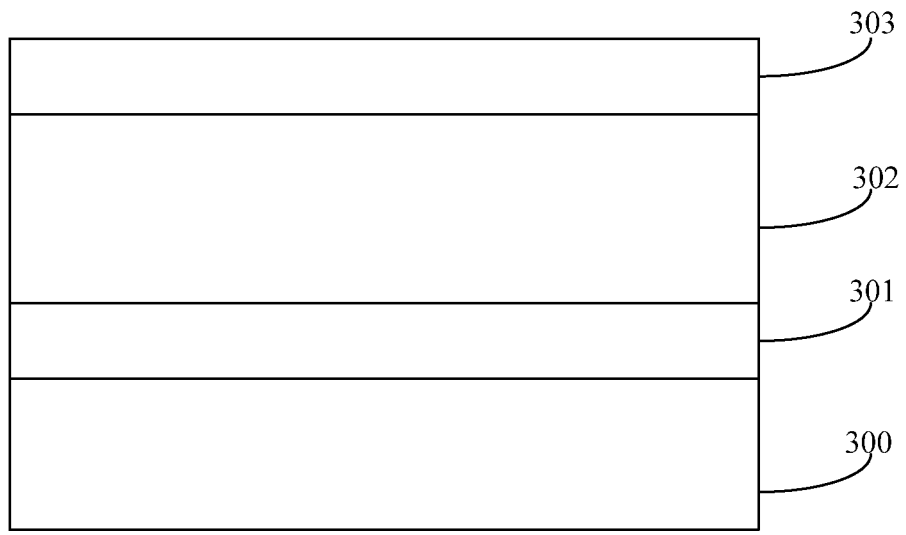
FIGS. 6 to 8 schematically illustrate sectional views of intermediate structures of a method for forming an interconnect structure with air gaps according to one embodiment of the present disclosure.

Referring to FIGS. 5 and 6, step S51 is performed. In S51, a semiconductor substrate 300 having semiconductor devices formed therein is provided.

In some embodiments, the semiconductor substrate 300 may include monocrystalline silicon, monocrystalline germanium, silicon-germanium, silicon carbide, silicon-on-insulator, germanium-on-insulator or other materials, such as group III-V compounds, for example gallium arsenide. In some embodiments, the semiconductor substrate 300 may have semiconductor devices formed therein, such as N-Mental-Oxide-Semiconductor (NMOS) transistor, P-Mental-Oxide-Semiconductor (PMOS) transistor, diode, capacitor and inductor.

Referring to FIGS. 5 and 6, step S52 is performed. In S52, a conductive layer 302, which is adapted to form an interconnect structure, is formed on the semiconductor substrate 300.

In some embodiments, before forming the conductive layer 302, an interlayer dielectric layer 301 may be formed on the semiconductor substrate 300, that is, the interlayer dielectric layer 301 is disposed between the semiconductor substrate 300 and the conductive layer 302. The interlayer dielectric layer 301 may be adapted to insulate the conductive layer 302 and the semiconductor devices. In some embodiments, the interlayer dielectric layer 301 may have a single-layer structure or a laminated construction. The interlayer dielectric layer 301 may include silicon dioxide, a low-K dielectric material or an ultra-low-K dielectric material, such as one or more of carbon-doped dielectric material, carbon-doped organosilicon glass, carbon-doped silicon dioxide, fluorosilicone glass and silicon oxycarbide. In some embodiments, the interlayer dielectric layer 301 may be formed by a Chemical Vapor Deposition (CVD) process.

In some embodiments, the conductive layer 302 may include a metal, namely, the conductive layer 302 may be a metal layer. When the conductive layer 302 is a metal layer, the metal layer may include aluminum or tungsten. In some embodiments, the metal layer may include aluminum. Since aluminum has low resistivity, it is generally used in metal interconnects and can reduce resistance of metal interconnects effectively. More importantly, aluminum is easily etched to form grooves between two adjacent metal layers in subsequent processes. In some embodiments, the metal layer may be formed by a sputtering process, but the present disclosure is not limited thereto. In some embodiments, the metal layer may be formed by other processes which are well known in the art.

Still referring to FIGS. 5 and 6, step S53 is performed. In S53, a mask layer 303 is formed on the conductive layer 302. The mask layer 303 is adapted to be a mask in a subsequent process of forming grooves and serve as a dielectric layer. In some embodiments, the mask layer 303 may be a hard mask layer which includes silicon oxide, silicon nitride or silicon oxynitride. The hard mask layer may be formed by a CVD process. The mask layer 393 may be adapted to increase a depth-to-width ratio of grooves formed in subsequent processes.

Figure 7:
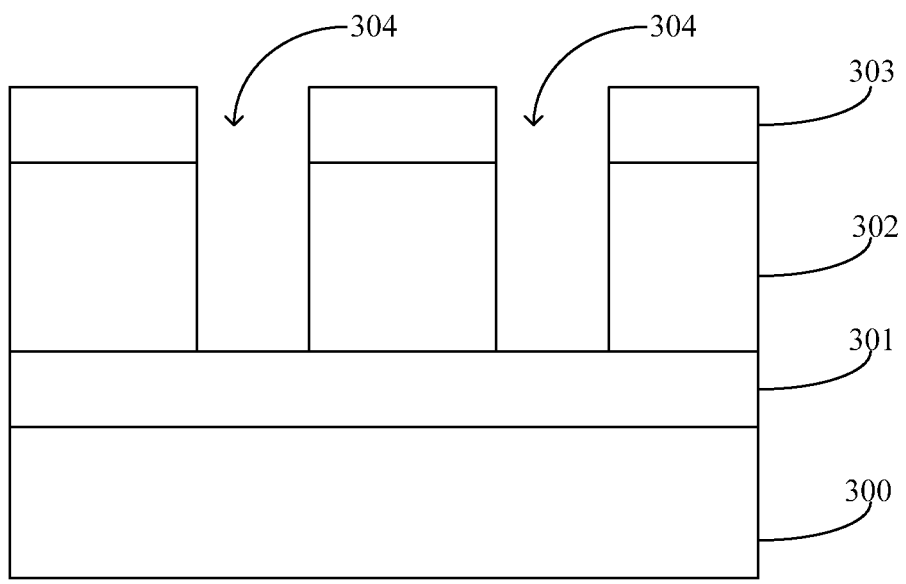

Referring to FIGS. 5 and 7, step S54 is performed. In S54, grooves 304 are formed in the mask layer 303 and the conductive layer 302, the grooves 304 having a depth-to-width ratio greater than 0.8. With such a depth-to-width ratio, air gaps are more easily formed in an intermetallic dielectric layer in the grooves to be formed in subsequent processes and the air gaps may have a relatively large size.

It should be noted that, since the formation and size of the air gaps are related to the depth-to-width ratio of the grooves between the interconnects, a thickness of the conductive layer which serves as the interconnects, such as a metal layer, may be certain or change within a very small range. In embodiments of the present disclosure, a mask layer with a certain thickness is formed on a conductive layer, so that a thickness of the conductive layer and a depth-to-width ratio of grooves between adjacent portions of the conductive layer are increased. Therefore, air gaps with a larger size may be formed between two adjacent portions of the conductive layer more easily.

In some embodiments, the grooves 304 may be formed by a photoetching process and an etching process. Specifically, the grooves 304 may be formed by: forming a patterned photoresist layer on the mask layer 303 which defines a position of the grooves 304; etching the mask layer 303 by taking the patterned photoresist layer as a mask; etching the conductive layer 302 by taking the patterned photoresist layer and the mask layer 303 as a mask until the semiconductor substrate 300 is exposed; and removing the patterned photoresist layer. If the interlayer dielectric layer 301 is disposed between the semiconductor substrate 300 and the conductive layer 302, the conductive layer 302 may be etched until the interlayer dielectric layer 301 is exposed. The conductive layer 302 serves as interconnects. In some embodiments, the mask layer 303 and the conductive layer 302 may be etched by a dry etching process, such as a plasma etching process.

Figure 8:
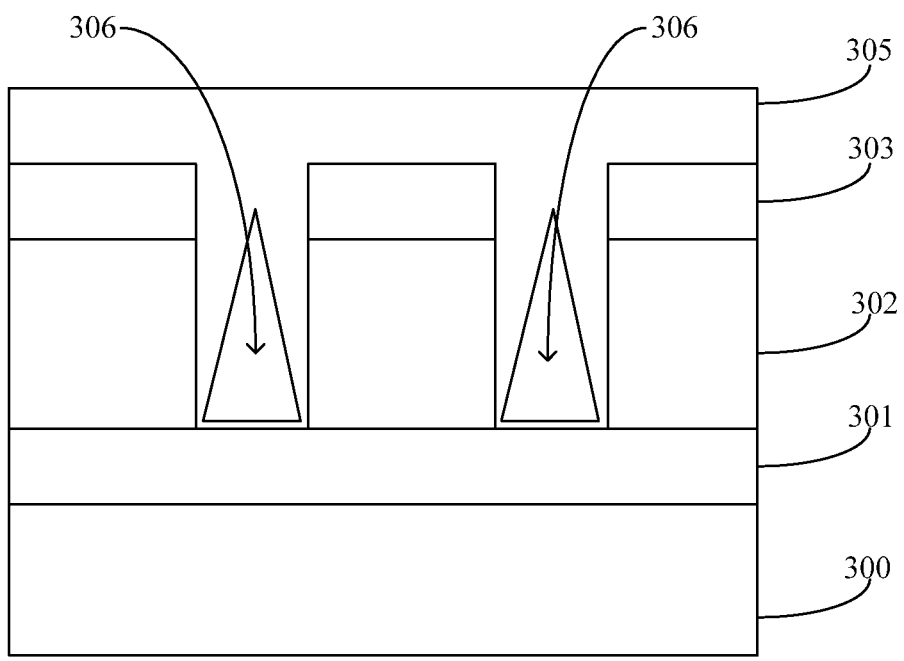

Referring to FIGS. 5, 7 and 8, step S55 is performed. In S55, an intermetallic dielectric layer 305 is deposited to cover the mask layer 303 and fill the grooves 304, and air gaps 306 are formed in a portion of the intermetallic dielectric layer 305 in the grooves 304. The size of the air gaps 306 may be relevant to the depth-to-width ratio of the grooves 304. The greater the depth-to-width ratio is, the more easily the air gaps 306 are formed in the portion of the intermetallic dielectric layer 305 and the larger the size of the formed air gaps 306 is. Compared to the conventional technologies, in the present disclosure, since the mask layer 303 is formed on the conductive layer 302, a height of the grooves 304 includes a height of the conductive layer 302 and a height of the mask layer 303, namely, the height of the grooves 304 is increased, so that the depth-to-width ratio of the grooves 304 between two adjacent interconnects is increased. With such a depth-to-width ratio, the size of the air gaps 306 formed in the portion of the intermetallic dielectric layer 305 in the grooves 304 may be increased when the intermetallic dielectric layer 305 is deposited, which may reduce the dielectric constant of the intermetallic dielectric layer 305 between two adjacent interconnects and further reduce or even eliminate parasitic capacitance between two adjacent interconnects. Therefore, RC delay between the semiconductor devices may be improved effectively and the performance of the semiconductor devices may be improved.

Referring to FIG. 8, in some embodiments, air gaps 306 may take the shape of a triangle, which is illustrated for view but not the practical shape of the air gaps 306. In practice, according to specific processes and implementation methods, the air gaps 306 may have other irregular shapes. No matter what shape the air gaps 306 have, forming a metal interconnect structure with air gaps according to the embodiments of the present disclosure is within the scope of the present disclosure.

In some embodiments, the intermetallic dielectric layer 305 may be made of silicon oxide, a low-K dielectric material or an ultra-low-K dielectric material. The intermetallic dielectric layer 305 made of a low-K dielectric material or an ultra-low-K dielectric material may reduce the dielectric constant and parasitic capacitance between adjacent interconnects. However, some low-K dielectric materials and ultra-low-K dielectric materials are very expensive and not widely used at present. In embodiments of the present disclosure, the intermetallic dielectric layer 305 made of a common dielectric material may be applied in forming an interconnect structure, which may not only reduce the dielectric constant and parasitic capacitance between adjacent interconnects effectively but also reduce production cost considerably. In some embodiments, the intermetallic dielectric layer 305 may be formed by a CVD process, such as a plasma enhanced chemical vapor deposition process, or other depositing processes, which is well known in the art and not described in detail here.

In some embodiments, after depositing an intermetallic dielectric layer, the intermetallic dielectric layer may not be completely even and have ups and downs along with patterns on a surface of the substrate. In some embodiments, a Chemical Mechanical Polishing (CMP) process may be employed to planarize the surface of the intermetallic dielectric layer, which is beneficial to subsequent manufacturing processes.

It should be noted that, the depth-to-width ratio of a space between two adjacent interconnects may not only related to the thickness of the interconnects but also related to the distance between two adjacent interconnects. Although the effect of the distance between two adjacent interconnects on the depth-to-width ratio of the space between two adjacent interconnects is not described here, the distance's effect on the depth-to-width ratio cannot be ignored. In practical applications, according to the distance between interconnects and the thickness of the interconnects, the thickness needs to be adjusted to reach a better depth-to-width ratio, which reduces parasitic capacitance between the interconnects. When a low-L dielectric material or an ultra-low-K dielectric material is not employed, the present disclosure may not only reduce parasitic capacitance between interconnects, but also reduce production cost. Furthermore, the method of the present disclosure may be applied to some particular processes, such as a radio frequency circuit, where parasitic capacitance between interconnects may be reduced considerably.

Referring to FIG. 8, in some embodiments, an interconnect structure is provided, including: a semiconductor substrate 300 having semiconductor devices formed therein; interconnects formed on the semiconductor substrate 300; a mask layer 303 formed on the interconnects; grooves 304 between two adjacent interconnects, which are formed in the mask layer 303 and the interconnects and have a depth-to-width ratio greater than 0.8, wherein the mask layer 303 enables the grooves 304 to have a much larger depth-to-width ratio; and an intermetallic dielectric layer 305 which covers the mask layer 303 and fills the grooves 304, wherein air gaps 306 are formed in a portion of the intermetallic dielectric layer 305 in the grooves 304.

In some embodiments, referring to FIG. 7, the grooves 304 have a depth-to-width ratio greater than 0.8 and the air gaps 306 have a relatively large size, which reduces the dielectric constant of the intermetallic dielectric layer 305 between two adjacent interconnects, reduces parasitic capacitance between two adjacent interconnects, and improves the performance of the interconnect structure.

In some embodiments, an interlayer dielectric layer 301 is formed between the semiconductor substrate 300 and the conductive layer 302 and covers the semiconductor substrate 300. The interlayer dielectric layer 301 may include silicon oxide, a low-K dielectric material, an ultra-low-K dielectric material or the like.

In some embodiments, the intermetallic dielectric layer 305 may include silicon oxide, a low-K dielectric material, an ultra-low-K dielectric material or the like.

In some embodiments, the mask layer 303 may include a hard mask layer which includes silicon oxide, silicon nitride or silicon oxynitride.

In some embodiments, the conductive layer 302 may include a metal, that is, the conductive layer 302 may be a metal layer. In some embodiments, the metal may be aluminum, copper or tungsten. The metal layer may serve as metal interconnects and the interconnect structure may be a metal interconnect structure.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A method for forming an interconnect structure, comprising:
   providing a semiconductor substrate that has semiconductor devices formed therein;
   forming a conductive layer on the semiconductor substrate;
   forming a mask layer on the conductive layer;
   forming a groove in the mask layer and the conductive layer, the groove having a depth-to-width ratio greater than 0.8, wherein a depth of the groove is a sum of a depth of the mask layer and a depth of the conductive layer; and
   depositing an intermetallic dielectric layer to cover the mask layer and fill the groove, wherein an air gap is formed in a portion of the intermetallic dielectric layer in the groove.

2. The method according to claim 1, further comprising: before forming the conductive layer, forming an interlayer dielectric layer on the semiconductor substrate.

3. The method according to claim 2, wherein the interlayer dielectric layer and the intermetallic dielectric layer comprise a low-K dielectric material or an ultra-low-K dielectric material.

4. The method according to claim 2, wherein the interlayer dielectric layer comprises silicon dioxide.

5. The method according to claim 1, wherein the intermetallic dielectric layer comprises silicon dioxide.

6. The method according to claim 1, wherein the mask layer comprises a hard mask layer.

7. The method according to claim 1, wherein the conductive layer comprises aluminum or tungsten.

8. The method according to claim 1, wherein the groove is formed by a photoetching process or an etching process.

9. The interconnect structure formed by the method according to claim 1, comprising:
the semiconductor substrate that has the semiconductor devices formed therein;
interconnects formed on the semiconductor substrate;
the mask layer, wherein the mask layer is formed on the interconnects;
the groove, wherein the groove is located between two adjacent interconnects, and wherein the groove has a depth-to-width ratio greater than 0.8; and
the intermetallic dielectric layer that covers the mask layer and fills the groove, wherein the air gap is formed in the portion of the intermetallic dielectric layer in the groove.

10. The interconnect structure according to claim 9, further comprising an interlayer dielectric layer, covering the semiconductor substrate, that is formed between the semiconductor substrate and the interconnects.

11. The interconnect structure according to claim 10, wherein the interlayer dielectric layer and the intermetallic dielectric layer comprise a low-K dielectric material or an ultra-low-K dielectric material.

12. The interconnect structure according to claim 9, wherein the intermetallic dielectric layer comprises silicon dioxide.

13. The interconnect structure according to claim 10, wherein the interlayer dielectric layer comprises silicon dioxide.

14. The interconnect structure according to claim 9, wherein the mask layer comprises a hard mask layer.

15. The interconnect structure according to claim 9, wherein the interconnects comprise aluminum or tungsten.

16. The interconnect structure according to claim 9, wherein the interconnects are formed by the conductive layer.

* * * * *